United States Patent [19]

Conboy

[11] Patent Number: 4,691,293
[45] Date of Patent: Sep. 1, 1987

[54] HIGH FREQUENCY, WIDE RANGE FIR FILTER

[75] Inventor: Leo W. Conboy, Huntington Beach, Calif.

[73] Assignee: Ford Aerospace & Communications Corporation, Detroit, Mich.

[21] Appl. No.: 687,088

[22] Filed: Dec. 28, 1984

[51] Int. Cl.[4] ................................................. G06F 7/38
[52] U.S. Cl. ...................................................... 364/724
[58] Field of Search ............................................ 364/724

[56] References Cited

U.S. PATENT DOCUMENTS

| | | | |
|---|---|---|---|
| 3,370,292 | 2/1968 | Deerfield | 343/5 |
| 3,633,170 | 1/1972 | Jones, Jr. | 340/172.5 |
| 3,696,235 | 10/1972 | Tufts | 235/156 |
| 3,704,364 | 11/1972 | Roeschlein et al. | 235/176 |
| 3,906,400 | 9/1975 | Gooding et al. | 332/11 D |
| 3,914,588 | 10/1975 | Nussbaumer | 235/156 |
| 3,959,637 | 5/1976 | Nussbaumer | 235/152 |
| 3,979,701 | 9/1976 | Tomozawa | 333/70 T |
| 3,987,288 | 10/1976 | Franks | 235/152 |
| 3,988,606 | 10/1976 | Eggermont | 235/156 |
| 3,988,607 | 10/1976 | Eggermont et al. | 364/724 |
| 3,997,773 | 12/1976 | Van Essen et al. | 364/724 |
| 4,031,377 | 6/1977 | Deutsch et al. | 235/164 |
| 4,031,378 | 6/1977 | LeComte | 235/164 |
| 4,185,325 | 1/1980 | Appel | 365/244 |
| 4,231,100 | 10/1980 | Eggermont | 364/724 |
| 4,231,101 | 10/1980 | Eggermont | 364/724 |
| 4,255,794 | 3/1981 | Nakayama | 364/724 |
| 4,356,558 | 10/1982 | Owen et al. | 364/724 |
| 4,573,135 | 2/1986 | Dieterich | 364/724 |
| 4,584,659 | 4/1986 | Stikvoort | 364/724 |

Primary Examiner—Archie E. Williams, Jr.
Assistant Examiner—Dale M. Shaw
Attorney, Agent, or Firm—Edward J. Radlo; Keith L. Zerschling; Harry Weissenberger

[57] ABSTRACT

The operating speed and dynamic input range of a digital FIR filter are markedly improved by encoding the signal by powers of two and using the thus encoded signal to shift (rather than multiply) the coefficient at each tap of the filter. A multiplexed shifter for simultaneously shifting all digits of the coefficient is also disclosed.

5 Claims, 15 Drawing Figures

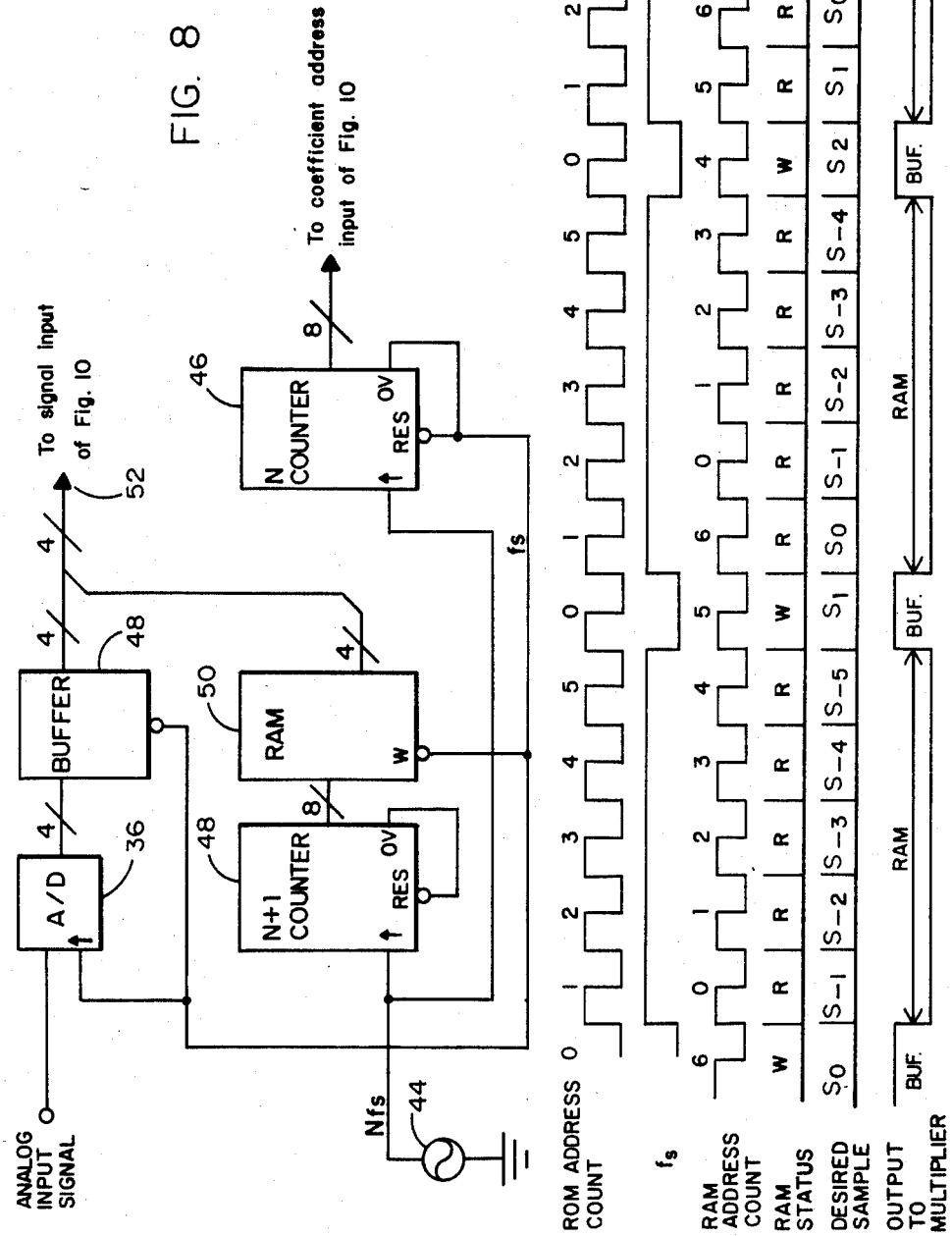

HIGH FREQUENCY, WIDE RANGE FIR FILTER

This invention relates to digital filters, and more specifically to an FIR filter combining a very high dynamic input range with a very high operating speed.

BACKGROUND OF THE INVENTION

Digital filters of various types are well-known. One type of digital filter is a finite impulse response (FIR) filter in which various proportions of current and delayed samples are added together to produce the current filtered sample. FIR filters are very desirable in many applications because their response characteristics can be changed simply by changing the coefficients by which the various delayed samples are multiplied.

In very high speed applications, however, the applicability of known FIR filters is severely limited. The reason for this limitation is that in order to maintain adjustability and avoid an unacceptable proliferation of hardware, the multiplications of the individual delayed samples by their respective coefficients must be performed sequentially. Inasmuch as the sharpness of the rolloff depends on the number of taps within the filter, a high-quality filter is therefore quite slow. Furthermore, high-speed devices require the use of flash-type analog-to-digital converters (ADC's) in which each signal level to be encoded requires a separate comparator. In certain applications such as radar, the signal range which must be accommodated by the ADC at the input of the filter may be on the order of 96 decibels. Inasmuch as it takes about one bit of digital code for each 6 db of signal range, a 96 db range requires 16 digital bits, i.e. more than 65,000 signal levels. The resulting hardware complexity in a flash ADC encoder makes it impossible in practice to process signals spanning such a wide dynamic input range at radar frequencies by conventional FIR filtering techniques.

It has been previously proposed to accelerate the operation of the filter by substituting much faster shifting operations for the multiplication operations in each tap of the filter. In order to do this, however, the coefficients had to be powers of 2 (see U.S. Pat. Nos. 3,696,235 to Tufts, 3,979,701 to Tomozawa, 3,988,606 to Eggermont, and 4,185,325 to Appel), and they could therefore not be set at precise enough values for the filter to have the exact desired characteristics. Furthermore, the resulting speed increase still did not solve the problem of handling a wide dynamic input range.

PRIOR ART

In addition to the U.S. patents listed above, the following U.S. patents disclose digital filters or multipliers of the general type involved in this technology:

| U.S. Pat. No. | Inventor |
| --- | --- |
| 3,906,400 | Gooding, et al |
| 3,633,170 | Jones, Jr. |
| 3,987,288 | Franks |
| 3,370,292 | Deerfield |
| 3,914,588 | Nussbaumer |
| 4,255,794 | Nakayama |
| 3,704,364 | Roeschlein, et al |
| 3,959,637 | Nussbaumer |
| 4,356,558 | Owen, et al |
| 3,979,701 | Potter |
| 4,031,377 | Deutsch, et al |
| 4,031,378 | LeComte |

SUMMARY OF THE INVENTION

The invention combines a wide dynamic input range with high operating speed by encoding the input signal (as opposed to the coefficients) not by single-step levels, but rather by powers-of-2 step levels. This procedure has two major advantages; first, it requires far fewer comparators in the flash ADC than does the prior art (for a 96 db range, 16 instead of 65,536); and second, it allows the use of precise coefficients because the multiplication can now be accomplished by shifting the coefficient rather than the signal. In addition, the system of this invention requires fewer bits in the shift registers and therefore allows the use of more taps with the same hardware.

In another of its aspects, the invention uses a multiplexed shifter for even greater speed.

It will be appreciated that the powers-of-2 signal encoding of this invention produces a more coarse approximation of the signal. However, if the filter is designed as a low-pass filter (as it would normally be in noise elimination applications), the convolution of the signal by the filter response curve inherently compensates for the coarser approximation by eliminating the high-frequency distortion introduced by the approximation.

BRIEF DESCRIPTION OF THE DRAWINGS

FIG. 8 is a block diagram of the delay line operating system of this invention;

FIGS. 9a-f are timing diagrams illustrating the operation of the system of FIG. 8.

DESCRIPTION OF THE PREFERRED EMBODIMENT

Digital FIR filters are extremely versatile and useful in situations where filter characteristics must be easily changeable. For example, the signal of FIG. 1 consists of two superimposed sine waves having frequencies of $f_1$ and $f_2 = 2f_1$, respectively, plus random highfrequency noise. The FIR filter described herein would make it possible, for example, to remove the noise alone, or to remove both the noise and the $f_2$ sine wave, simply by changing the sampling frequency $f_s$ at a touch of a switch.

Figure 1:
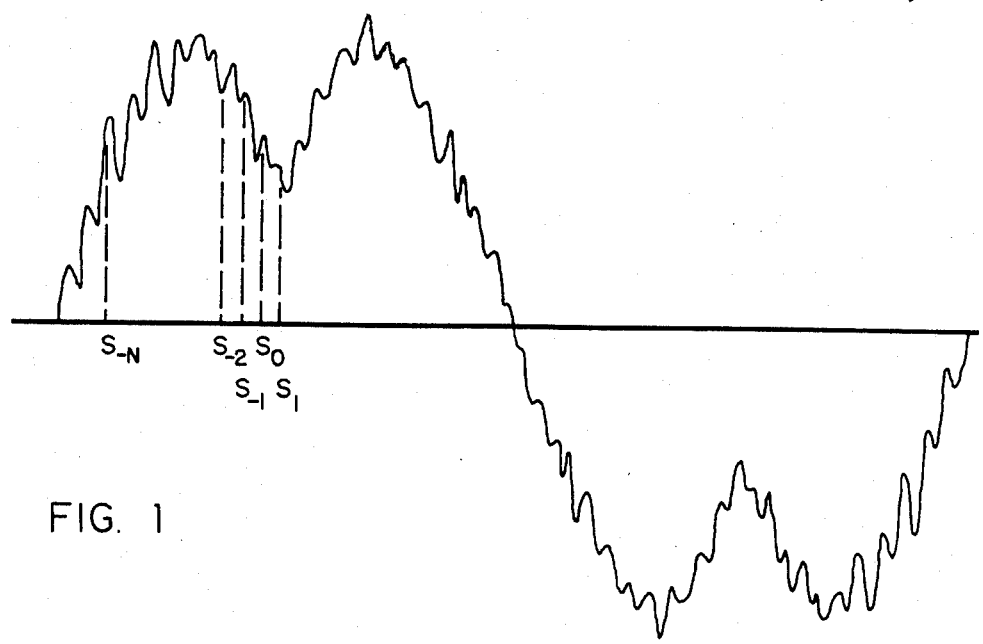
FIG. 1 is a time-amplitude diagram illustrating the sampling of a noisy signal to be filtered.
Figure 2:
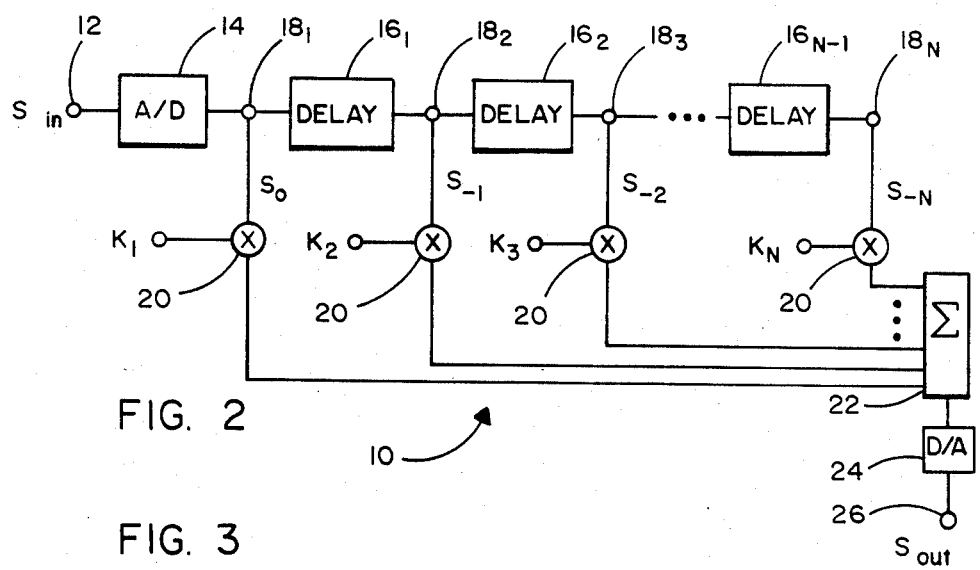
FIG. 2 is a block diagram illustrating the basic principles of an FIR filter.

FIG. 2 illustrates the general nature of an FIR filter such as might be suitable for filtering the noisy sinewave signal of FIG. 1. In the filter 10, a periodically sampled incoming signal 12 is applied to an analog-to-digital converter 14 whose digital output is fed into a delay line 16 consisting of identical delay elements $16_1$ through $16_N$. Each of the delay elements 16 delays the signal by one sample period, so that the junctions or taps $18_0$ through $18_N$ see a series of successive samples of the incoming segment 12, $18_0$ seeing the current sample $S_0$ and $18_n$ the oldest sample $S_{-N}$. Each of the delayed samples S is individually multiplied by a coefficient $K_0$ throu $K_N$ in a multiplier 20. The various samples S multiplied by the individual coefficients K are summed in an adder 22 and then reconverted to analog form in the digital-to-analog converter 24 to produce an analog output 26.

Figure 3:
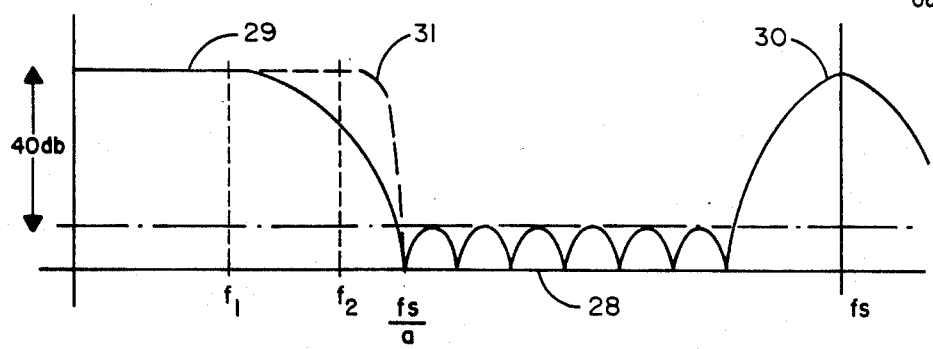
FIG. 3 is a frequency response curve illustrating the typical response curve of a low-pass FIR filter.

The coefficients $K_0$ through $K_N$ are chosen in accordance with known mathematical principles to product the filter response illustrated in FIG. 3. The response of the filter 10 is generally level until it approaches a predetermined fraction $f_s/a$ of the sampling frequency $f_s$. The value of "a" is determined by the choice of the coefficients $K_0$ through $K_N$. Beyond the rolloff frequency $f_s/a$, the response curve of filter 10 exhibits a series of bounces or secondary peaks 28 which, with a proper choice of the coefficients $K_1$ through $K_N$, can be kept below 40 db down from the level portion 29 of the response curve. As the sampling frequency is approached, the response curve of filter 10 rises to a peak 30 at the sampling frequency which is essentially as high as the level response 29. A major advantage of an FIR filter is that not only can the rolloff frequency be varied with respect to the sampling frequency by a judicious choice of coefficients, and the rolloff curve be sharpened (as at 31) merely by the provision of additional taps 18, but the rolloff frequency can also be varied by the simple expedient of changing sampling frequencies. Due to the peak of the response curve at the sampling frequency, measures must be taken to eliminate any signal components lying above the lowest sampling frequency being considered, as by passing the incoming signal through a low pass filter prior to the input A/D converter 14.

Although FIR filters thus have many useful qualities, their use is limited in practical applications by bulk, cost and power considerations. Multipliers are inherently slow, yet because digital multipliers require a relatively large amount of circuitry, it is usually necessary to provide a single multiplier in which the multiplications for the various taps 18 are carried out in sequence. The combination of these factors requires a relatively long processing time for each signal sample and thereby limits the frequencies which can be accommodated by the filter Furthermore, the analog-to-digital conversion of the input signals at high frequencies must be accomplished by so-called flash converters, again because sequential converters are too slow in their operation. The problem with flash converters is that they need a separate comparator for each level of signal to be encoded. In very wide-range signals such as radar signals, which are apt to span as much as a 96 db range, this would mean in excess of 65,000 comparators in the converter—an impossible requirement for compact, low-cost filters. By eliminating multiplications from the filter algorithm, large savings in computation time can be realized, and the sampling frequency of the filter can be correspondingly increased. For example, the fastest multiplication commercially available at the present time require between 35 and 150 nanoseconds to perform a multiplication. By contrast, the multiplexed shifter of this invention can perform a shift in as little as one or two nanoseconds when components embodying the latest electronic technology are used.

Multiplications in a binary system can be eliminated by simply shifting the multiplicand, provided the multiplier is always an integral power of 2. Specifically, shifting a binary number n digit positions to the left is the same as multiplying it by $2^n$. Conversely, shifting it to the right by n digit positions is the same as multiplying it by $2^{-n}$.

Figure 4:
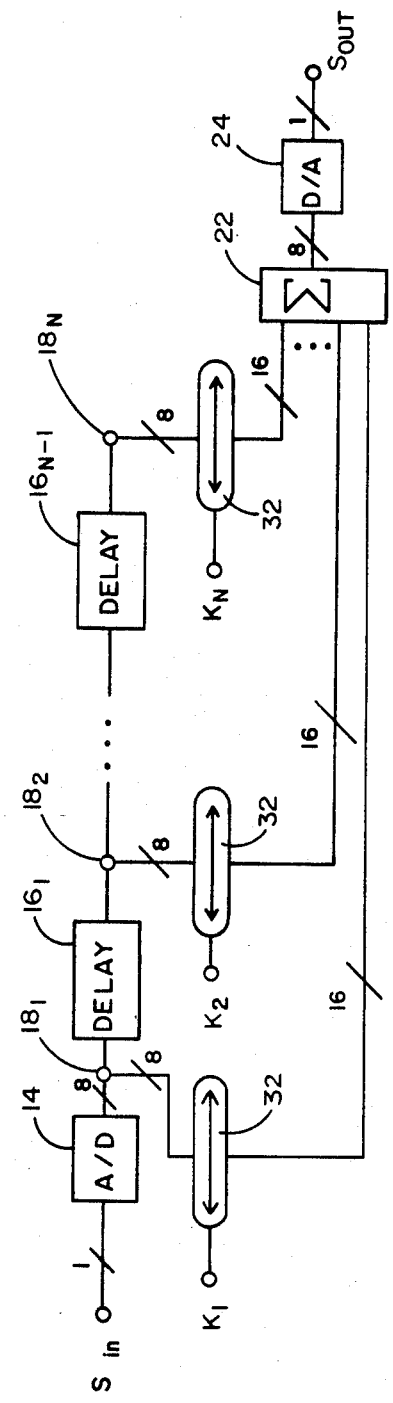
FIG. 4 is a block diagram illustrating a prior art FIR filter.
Figure 5:
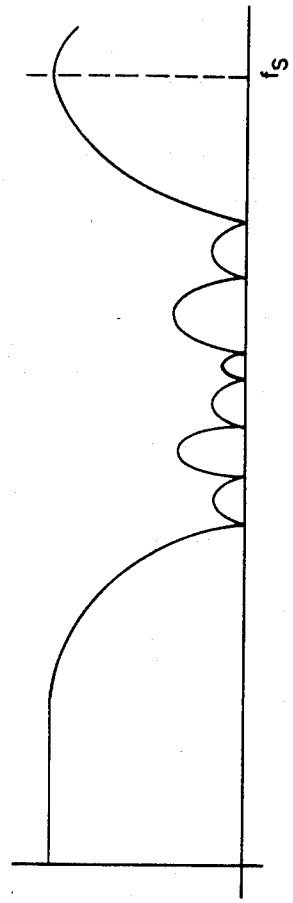
FIG. 5 is a frequency response diagram illustrating the response of the prior art filter of FIG. 5.

The frequency limitation problem has previously been addressed in the foregoing manner by the scheme shown in FIG. 4. In that prior art scheme, the coefficients K were so chosen as to be integral powers of 2. This allowed the multiplier to be configured as a digit shifter 32 in which the eight-bit binary sample was simply shifted by a certain number of positions to the left or the right. A shifter of this type is much simpler than a multiplier and operates much faster.

The scheme of FIG. 4 greatly expanded the range of frequencies with which an FIR filter could deal, but it introduced other problems. Because of the inability to use precise values of K, the filter characteristics were not fully adjustable. Furthermore, the prior art scheme of FIG. 4 did nothing to improve the dynamic signal range capable of being handled by the filter.

Figures 6, 7:
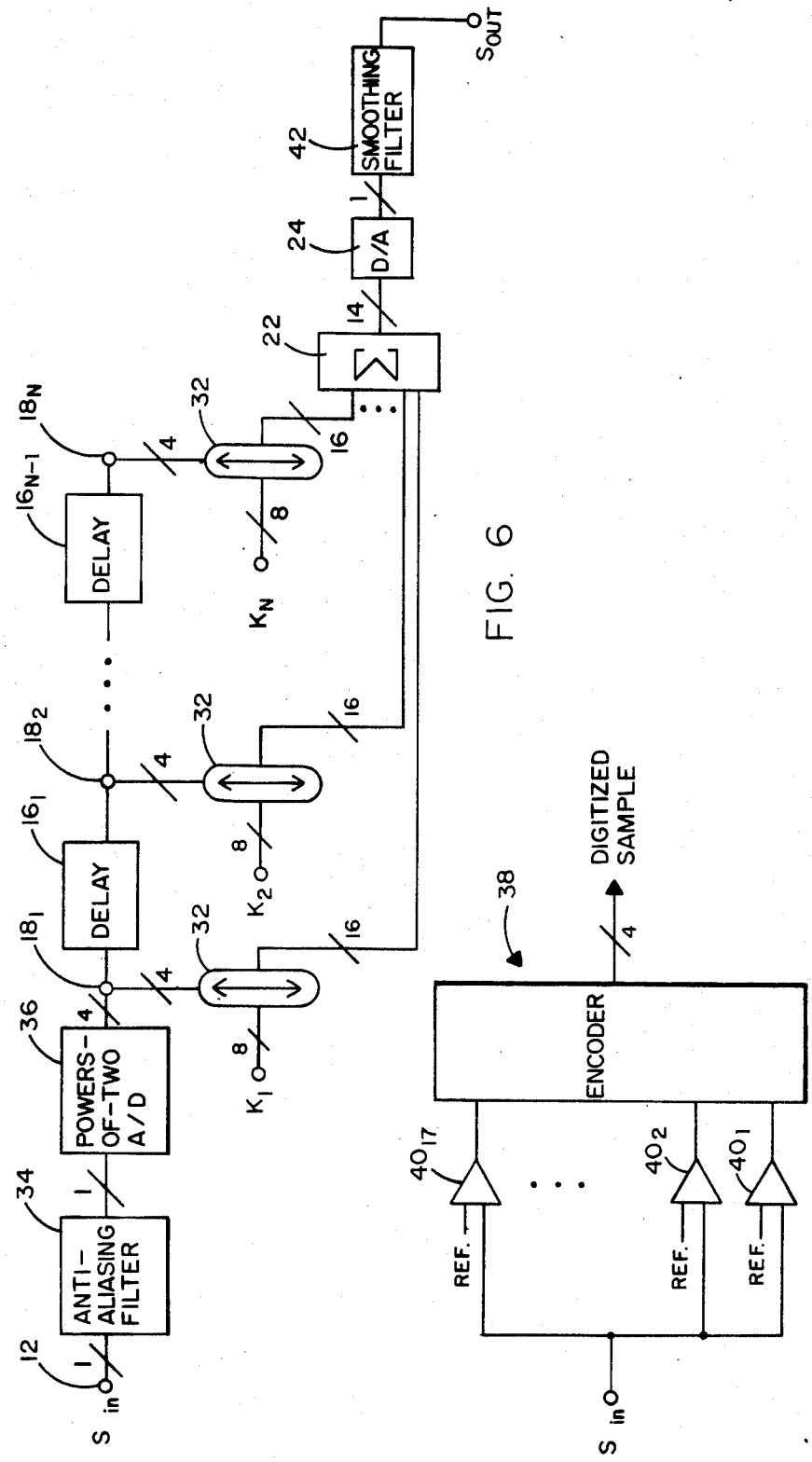
FIG. 6 is a block diagram illustrating the functioning of the filter of this invention.
FIG. 7 is a block diagram illustrating the flash ADC used in the filter of this invention.

FIG. 6 shows the way in which the present invention solves the problems of FIG. 4 while at the same time retaining the high frequency range of the prior art scheme and adding the ability for the filter to handle a very wide dynamic signal range. The gist of the invention is the concept of using shifters 32 as in the prior art scheme of FIG. 4, but shifting the coefficient rather than the sample. As a result, it is possible to use exact coefficients so as to improve the adjustability of the filter characteristics. In addition, the number of bits required to express the digitized sample signal can be cut by $\log_2$, thus allowing a vast expansion of the dynamic range of the input signal.

The invention accomplishes this by digitally encoding the input signal on a powers-of-two basis. For example, a conventional A/D converter might encode 256 separate equidistant signal levels by translating them into an 8 bit binary number. By contrast, for the same signal, the filter of this invention encodes only sixteen separate non-zero signal levels, those levels being levels $\pm 1, \pm 2, \pm 4, \pm 8, \pm 16, \pm 32, \pm 64$, and $\pm 128$. It will be appreciated that if a signal is encoded in this manner, considerable distortion will occur. However, the nature of that distortion is the addition of high-frequency signal components which are inherently eliminated by the filtering action of the filter itself, and which can additionally be removed by using a smoothing filter following the reconversion of the signal to analog form.

Referring now to FIG. 6, the incoming signal 12 is first passed through an anti-aliasing filter 34. The filter 34 is a low-pass filter whose rolloff frequency is below the lowest sampling frequency $f_s$ envisioned in the operation of the apparatus, yet above the highest envisioned rolloff frequency $f_s/a$ of the filter 10. The resulting analog signal is applied to a powers-of-two A/D converter 36 which consists essentially of the flash encoder 38 shown in FIG. 7. The flash encoder 38 contains, in the preferred embodiment, seventeen comparators $40_1$ through $40_{17}$ whose reference inputs are zero and the sixteen signal levels described above. The encoder 38, by simple and well known circuit means, translates the seventeen comparator outputs into a 3-bit signed digitized sample which is then applied to the delay elements 16. The various samples appearing at taps 18 are then applied sequentially to shifters 32 and used to shift the respective coefficients K. The resulting values for the various taps 18 are summed in the adder 22. The output of adder 22 represents the digital output signal which is reconverted to analog form in the D/A converter 24 and is then smoothed out by an analog smoothing filter 42.

Figure 10:
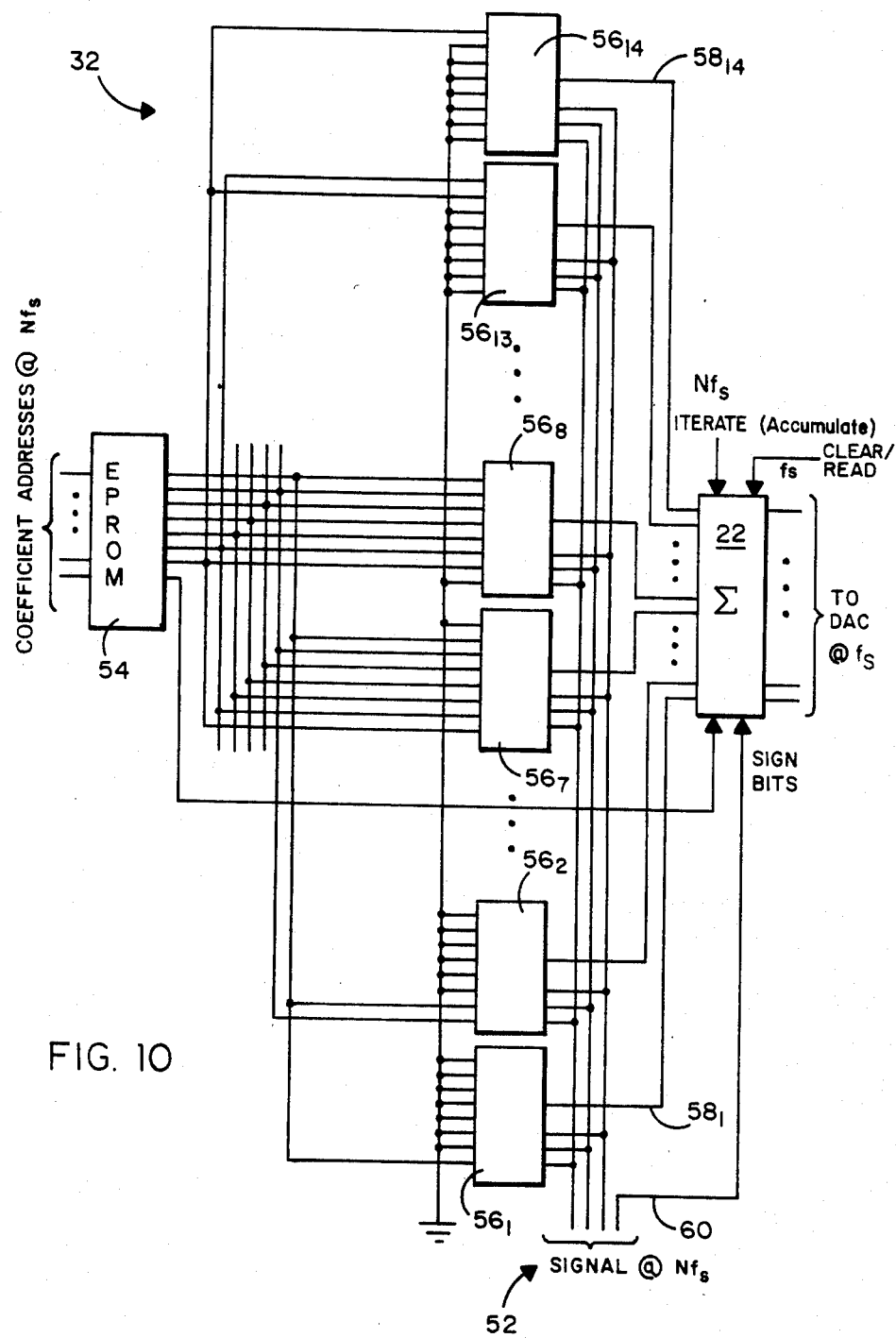
FIG. 10 is a block diagram of the shifting circuitry of this invention.

The actual manner in which the circuit of this invention operates is illustrated in FIGS. 8 through 10 for convenience in connection with a five-tap, 48 db signal range FIR filter. (The embodiment shown in FIG. 8 is in fact useable with FIR filters having as many as 256 taps.) Referring to FIG. 8, an oscillator 44 drives the circuit at a clock frequency of $Nf_s$ (FIGS. 9a and 9c), N being the number of taps 18. The clock signal is applied to a cyclic N counter 46 whose Nth output triggers the $f_s$ signal of FIG. 9b. The $f_s$ signal is applied to the A/D converter 36 to time the receiving of successive samples, and to a buffer 48 which retains the previous sample. The $Nf_s$ clock signal is also applied to a cyclic N+1 counter 48. The count of the N+1 counter 48 is applied as the address to a random access memory 50 whose write input is tied to the $f_s$ signal of FIG. 9b.

As will be seen from FIGS. 9d and 9e the contents of RAM 50 are read into the signal line 52 by successively addressing RAM addresses 0, 1, 2, 3 and 4 which contain, respectively, samples $S_{-1}$ through $S_{-s}$ as a result of previous iterations. When the $f_s$ pulse of FIG. 9b goes low, the contents of the buffer 48 (which are now sample $S_1$) are written into location 5 of the RAM 50. At the same time, sample $S_1$ is fed into line 52. When the $f_s$ pulse goes high again, the contents of RAM 50 are read into line 52, beginning this time with address 6 and ending with address 3. Another write cycle then occurs, in which sample $S_2$ is stored at address 4 of RAM 50. The next read cycle then starts with address 5 in RAM 50 which now contains sample $S_1$. It will be seen that the digital signals appearing on line 52 are successive cycles of six samples starting with the most recent and ending with the oldest, each cycle beginning one sample later than the previous cycle.

A material speed advantage arises from the multiplexed shifter of this invention shown in FIG. 10. The various coefficients needed for the operation of the device are stored in a read-only memory 54 which is addressed by the output of N counter 46. For each count of the N counter 46, the ROM 54 puts out a coefficient which consists of seven numerical bits and a sign bit. Each of the numerical bits put out by ROM 54 is applied to at least one of the switches $56_1$ through $56_{14}$. However, they are applied to each of the switches 56 in a different input position. Which input position in each switch 56 is connected to the output 58 of that switch is determined by the binary value of the signal 52. In the embodiment shown, the signal 52 contains three numerical bits and a sign bit 60.

The outputs $58_1$ through $58_{14}$ are simultaneously applied to the adder 22 and represent the product of the signal and the coefficient for that particular count or iteration of N counter 46. By accumulating the results of successive iterations of the shifter 32 and reading the accumulated totals into the D/A converter 24 at the trailing edge of each $f_s$ pulse, the sum of the products for any given sample is applied to the D/A converter 24.

It will be seen that the present invention provides an extremely simple and fast acting FIR filter with a large dynamic range. For example, if the dynamic range of the samples S is 96 db, a sixteen-bit number is required to express the number of individual levels within that range. By using the powers-of-two scheme of this invention, that sixteen-bit number can be reduced to a signed four-bit number. In a flash converter, the encoding of this signed four-bit number would require only 33 comparators. It will be appreciated that the complexity of the RAMs and shifters in such an application would also be increased from that shown in this description, but the increase remains within manageable proportions in the light of presentday technology.

I claim:

1. A digital FIR filter, comprising:
   (a) a source of time-spaced analog samples of a signal to be filtered;
   (b) encoding means for converting said samples into a digital code representative of signal levels differing from each other by powers of two;
   (c) first storage means for storing a predetermined sequence of said digitally encoded signal samples;
   (d) second storage means for storing a plurality of predetermined coefficients;
   (e) shifting means for multiplying each sample of said sequence by one of said coefficients through shifting the digits of said coefficient by a number of positions determined by said digital code; and
   (f) accumulator means for producing a digital value representative of the sum of said multiplications.

2. The filter of claim 1, in which said encoding means is a flash encoder.

3. The filter of claim 1, in which said first storage means is a random access memory.

4. The filter of claim 1, in which said second storage means is a read-only memory.

5. The filter of claim 1, in which said shifting means include:
   (i) a first counter arranged to count N+1 steps, where N is the number of samples in said sequence; said first counter being further arranged to cyclically address N+1 storage locations of said first storage means;
   (ii) a second counter arranged to count N steps; said second counter being further arranged to cyclically address N storage locations of said second storage means;
   (iii) a counting clock arranged to step said counters at a rate of $Nf_s$, where $f_s$ is the sampling frequency of said signal source;
   (iv) a read-write clock arranged to write new digital codes into said first storage means at a rate of $f_s$, said new digital codes being written into the storage location of said first storage means addressed at the moment of writing; the digital code used for said shifting of said coefficient digits being said new digital code during said writing, and the code stored in the then addressed location of said first storage means at all other times.

* * * * *